US007223631B2

United States Patent
Li et al.

(10) Patent No.: US 7,223,631 B2
(45) Date of Patent: *May 29, 2007

(54) WINDOWED PACKAGE HAVING EMBEDDED FRAME

(75) Inventors: Zong-Fu Li, Gilbert, AZ (US); Kabul Sengupta, Tempe, AZ (US); Deborah L. Thompson, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/360,147

(22) Filed: Feb. 22, 2006

(65) Prior Publication Data

US 2006/0141674 A1 Jun. 29, 2006

Related U.S. Application Data

(60) Division of application No. 10/777,373, filed on Feb. 11, 2004, now Pat. No. 7,026,707, which is a continuation of application No. 09/546,225, filed on Apr. 10, 2000, now Pat. No. 6,692,993, which is a division of application No. 09/219,186, filed on Dec. 21, 1998, now Pat. No. 6,072,232, which is a continuation-in-part of application No. 09/172,734, filed on Oct. 13, 1998, now Pat. No. 6,753,922.

(51) Int. Cl.
   *H01L 21/44* (2006.01)
(52) U.S. Cl. ........................... 438/106; 438/126
(58) Field of Classification Search ................ 438/106, 438/116, 125, 126, 121, 122, 127; 257/680, 257/796

See application file for complete search history.

(56) References Cited

U.S. PATENT DOCUMENTS

| | | | |
|---|---|---|---|
| 4,285,002 A | 8/1981 | Campbell | |
| 4,626,960 A | 12/1986 | Hamano et al. | |
| 4,663,833 A | 5/1987 | Tanaka et al. | |
| 5,233,222 A * | 8/1993 | Djennas et al. | 257/676 |
| 5,343,076 A | 8/1994 | Katayama et al. | |
| 5,399,805 A | 3/1995 | Tyler et al. | |
| 5,471,011 A | 11/1995 | Maslakow | |
| 5,498,900 A | 3/1996 | Dunaway et al. | |
| 5,701,033 A | 12/1997 | Ueda et al. | |
| 5,814,883 A | 9/1998 | Sawai et al. | |
| 5,821,617 A | 10/1998 | Autry et al. | |
| 5,907,769 A * | 5/1999 | Corisis | 438/123 |
| 6,028,351 A | 2/2000 | Klonis et al. | |

(Continued)

FOREIGN PATENT DOCUMENTS

DE        93 14 355 U1      3/1994

(Continued)

*Primary Examiner*—Tuan H. Nguyen
(74) *Attorney, Agent, or Firm*—Blakely, Sokoloff, Taylor & Zafman LLP

(57) ABSTRACT

An integrated circuit (IC) package includes a mold compound, a die, and a window. The mold compound has a frame embedded within it. The frame has a top surface, a bottom surface, and a top-to-bottom opening therein. The die is attached to the mold compound, wherein the embedded frame lies below a periphery of the die. The window is attached to the mold compound and located above the die to allow light to reach the die.

9 Claims, 7 Drawing Sheets

U.S. PATENT DOCUMENTS

| | | |
|---|---|---|
| 6,072,232 A | 6/2000 | Li et al. |
| 6,121,675 A | 9/2000 | Fukamura et al. |
| 6,191,359 B1 | 2/2001 | Sengupta et al. |
| 6,191,490 B1 * | 2/2001 | Huang ................. 257/782 |
| 6,326,678 B1 | 12/2001 | Karnezos et al. |
| RE37,690 E | 5/2002 | Kitano et al. |
| 6,692,993 B2 | 2/2004 | Li et al. |
| 6,753,922 B1 | 6/2004 | Sengupta et al. |

FOREIGN PATENT DOCUMENTS

| | | |
|---|---|---|
| DE | 196 18 101 A1 | 11/1997 |
| FR | 2 684 803 A1 | 6/1993 |
| JP | 62020358 | 1/1987 |
| JP | 62174956 | 7/1987 |
| JP | 9092748 | 4/1997 |
| JP | 63042150 | 2/1998 |

* cited by examiner

WINDOWED PACKAGE HAVING EMBEDDED FRAME

This application is a divisional of Ser. No. 10/777,373, filed Feb. 11, 2004, now U.S. Pat. No. 7,026,707 entitled "Windowed Package Having Embedded frame", which is a continuation application of Ser. No. 09/546,225, filed Apr. 10, 2000, now U.S. Pat. No. 6,692,993 which is a divisional application of Ser. No. 09/219,186, filed on Dec. 21, 1998, now U.S. Pat. No. 6,072,232 which is a continuation-in-part of application Ser. No. 09/172,734, filed on Oct. 13, 1998, now U.S. Pat. No. 6,753,922 entitled "Image Sensor Mounted by Mass Reflow."

BACKGROUND OF THE INVENTION

1. Field of the Invention

The described invention relates to the field of integrated circuit packages. In particular, the invention relates to an integrated circuit package capable of being mounted to a circuit board via a mass reflow process.

2. Description of Related Art

A windowed integrated circuit package is used for various applications in which an integrated circuit is illuminated or irradiated by light or other radiation sources located outside the integrated circuit package. An image sensor is one use of a windowed integrated circuit package.

For example, a photodiode array may be placed within a windowed integrated circuit package. The photo-detector array provides an image data output based upon the light incident on the photo-detector array. The photo-detector array may be used for capturing images or for other image reproduction applications. A color filter array (FA) material is used with the photo-detector to filter the light impinging on the image sensor to allow for the formation of full color images. Each filter allows a predetermined color of light to reach a corresponding photo-detector, thus determining what color light will be sensed by the photo-detector. By grouping sets of light sensors together, the intensity and color of light reaching an area can be determined.

Integrated circuit (IC) packages are mounted on circuit boards by various techniques including mass reflow and manual and hot bar soldering of the package to the circuit board. Manual soldering and hot bar soldering, however, are relatively slow and expensive processes.

Mass reflow board mounting is a faster, automated process. Mass reflow refers to one of several different techniques that raise the temperature of the IC package to approximately 215 to 225° C. At these elevated temperatures, solder residing on pads of the integrated circuit board melts and adheres to leads on the IC package. After the solder cools, the IC package remains firmly coupled to the solder pads. Mass reflow includes infrared, convection, and vapor phase techniques.

Non-ceramic packages such as windowed plastic packages are more desirable than ceramic packages because they are of lower cost than corresponding ceramic windowed packages. However, until recently, standard windowed plastic packages tested on the mass reflow process exhibited problems such as cracked lids, delamination of the die from the die attach, and lid-sealant separation due to thermal expansion mismatch between the plastic and glass window. Until recently, these windowed plastic packages were mounted to circuit boards using techniques such as manual soldering that keep the package bulk from reaching the elevated temperatures of the mass reflow process.

Co-pending U.S. Patent application Ser. No. 09/172,710, entitled "Mass Reflowable Windowed Non-Ceramic Package," assigned to Intel Corporation and Kyocera Corporation describes a windowed non-ceramic package that does meet the thermal requirements for mass reflow board mounting. However, a way of reducing internal stresses is desirable. This would allow extended bake times to be reduced or eliminated, and larger package sizes to be mass reflowed.

DETAILED DESCRIPTION

An improvement to a windowed non-ceramic integrated circuit (IC) package capable of being mounted via a mass reflow process is disclosed. A frame is embedded in the mold compound of the IC package. This reduces the stresses internal to the IC package when raised to the high temperatures associated with mass reflow.

Applicants have found that modifying a windowed plastic QFP package available through Kyocera Corporation based in Kyoto, Japan allows the plastic package to withstand the mass reflow process without the lid separating from the molded package or the die delaminating from the molded package. Additionally, the non-ceramic IC package may be combined with a FA material with high temperature stability to produce an image sensor that maintains its color performance despite being exposed to a mass reflow process.

The following section describes the IC package capable of being mass reflowed that is also described in co-pending U.S. patent application Ser. No. 09/172,710, entitled "Mass Reflowable Windowed Non-Ceramic Package," assigned to Intel Corporation and Kyocera Corporation. The subsequent section describes the improvement of adding an embedded frame into the mold compound of the IC package.

Mass Reflowable Windowed Non-Ceramic Package

Figure 1:
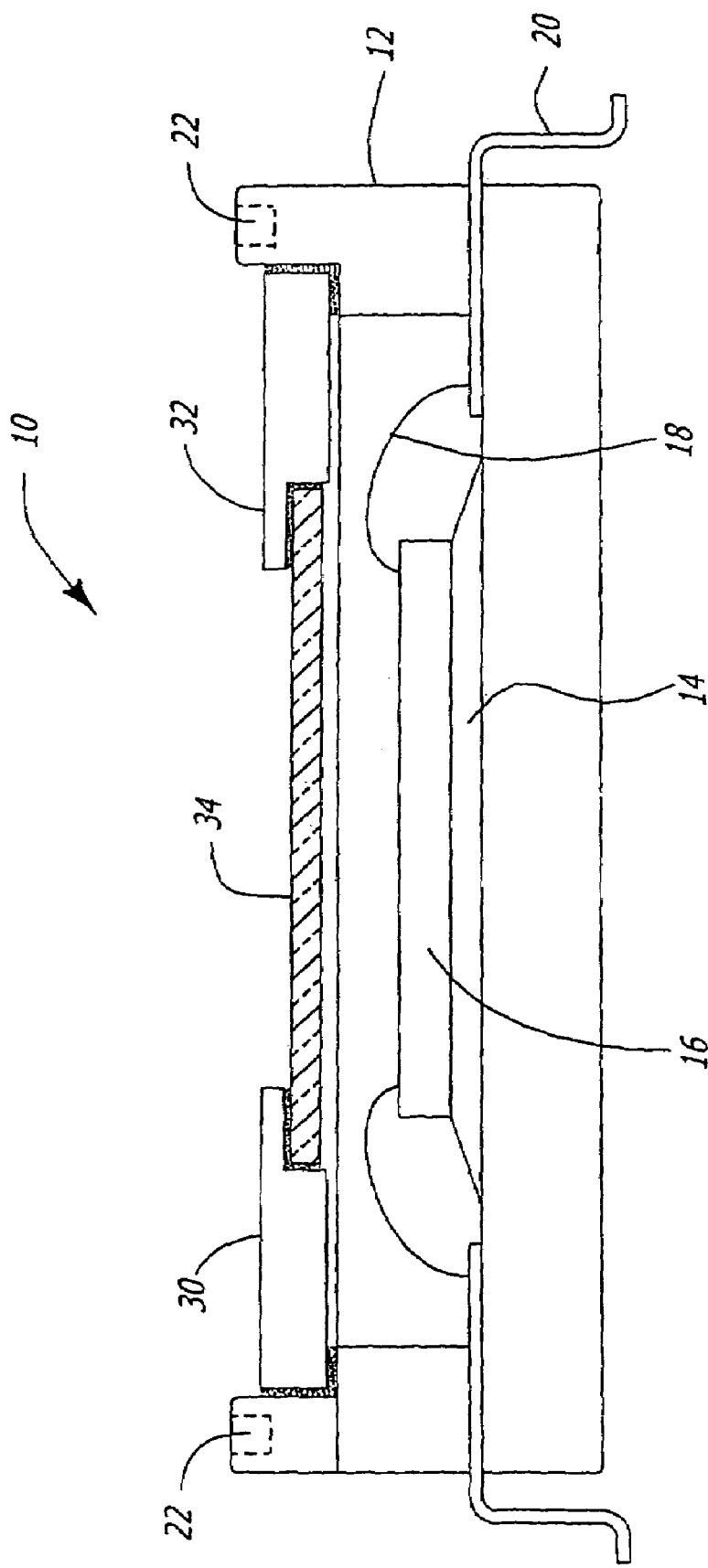
FIG. 1 shows a cross sectional block diagram of the windowed quad flat pack (QFP) package 10 as modified by the Applicants.

FIG. 1 shows a cross sectional block diagram of a windowed QFP package 10 that is mass reflowable. A non-ceramic molded package 12 makes up the package body. For one embodiment, the non-ceramic molded package is made with a low-moisture plastic, such as a low-moisture mold compound of ortho-cresol-novolac developed by Kyocera Corporation. For one embodiment, depressions 22 indicate where ejector pins were used to remove the molded package after being formed. Appendix 1 includes an example of the material characteristics of a low-moisture mold compound of Kyocera Corporation.

Die attach 14 is used to hold the die 16 in place. For one embodiment, the die attach 14 is a low rigidity epoxy such as a silver-filled epoxy manufactured by Ablestik Electronic Materials and Adhesives, based in Rancho Dominguez, Calif.

Wire bonds 18 attach the die 16 to a lead frame 20. The die attach 14 is selected to withstand the elevated temperatures of the mass reflow process. Delamination of the die 16 from the die attach 14 or molded package 12 may be a problem during mass reflow. Applicants have determined that a two step cure process for the die attach, as will be discussed with respect to FIG. 3, solves this problem.

A lid 30 seals the molded package. For one embodiment, the lid 30 comprises a ceramic frame 32 made of alumina. The ceramic frame 32 holds a transparent window. For one embodiment, the ceramic frame 32 includes a recessed ledge within which a glass window 34 resides. For one embodiment, the molded package 12 and the ceramic frame 32 are sealed using a bis-phenol A type epoxy. The epoxy seal may also be used to seal the ceramic frame 32 to the glass window 34. Appendix 2 summarizes the characteristics of a bis-phenol A-type sealant that is suitable for use with the present invention.

The modified windowed package is particularly suited for, but not limited to, Complementary Metal Oxide Semiconductor (CMOS) image sensors because their die size are relatively large (they can exceed 240 mils by 240 mils). An embodiment of the package suitable for an image sensor includes a window having a slightly larger area than that of the light-sensitive portion of the die.

Figure 2:
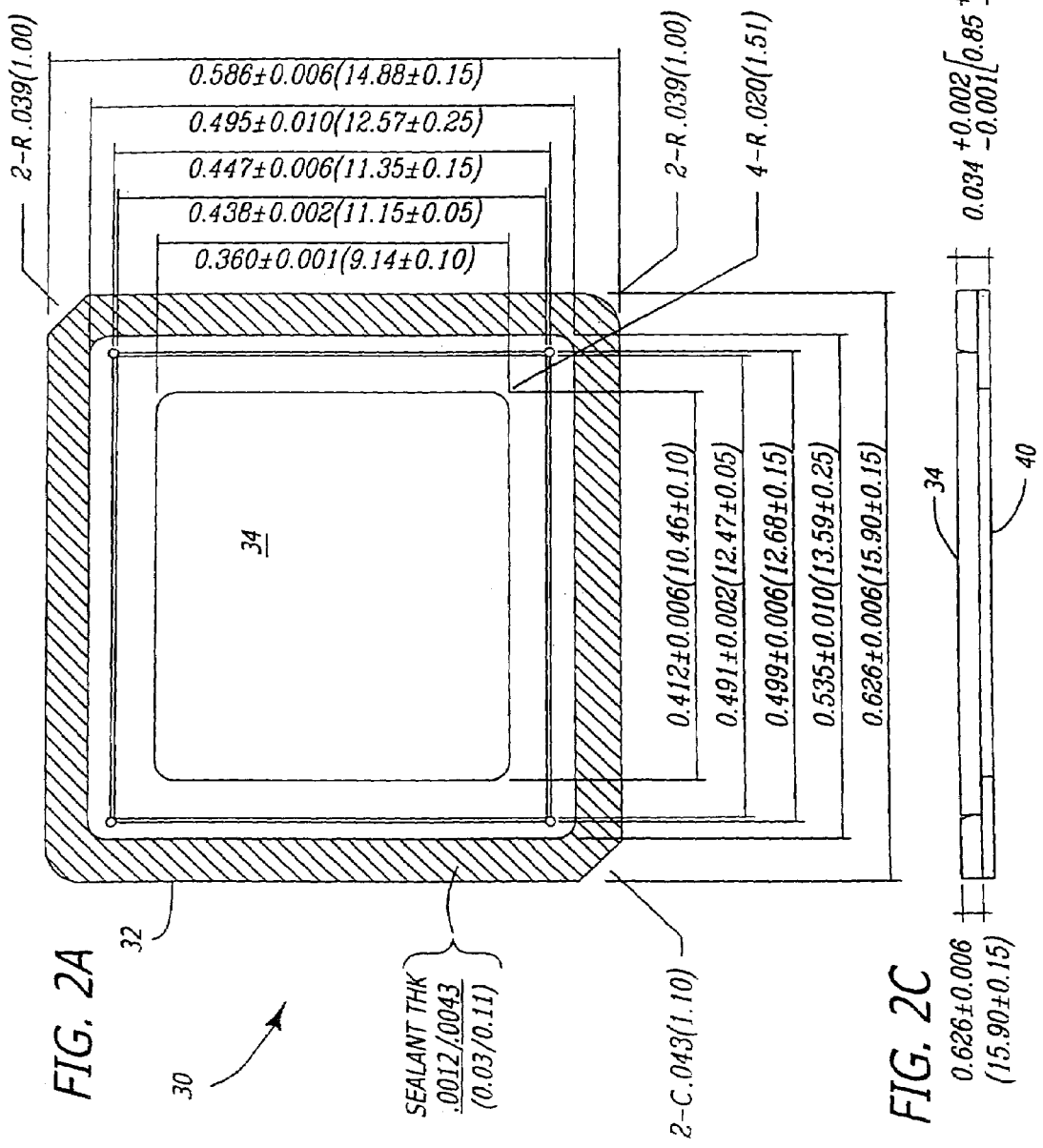
FIG. 2A shows a schematic diagram of one embodiment of the package lid, including the ceramic frame and glass window.
FIG. 2B shows a side view of the package lid.
FIG. 2C shows another side view of the package lid.
Figure 3:
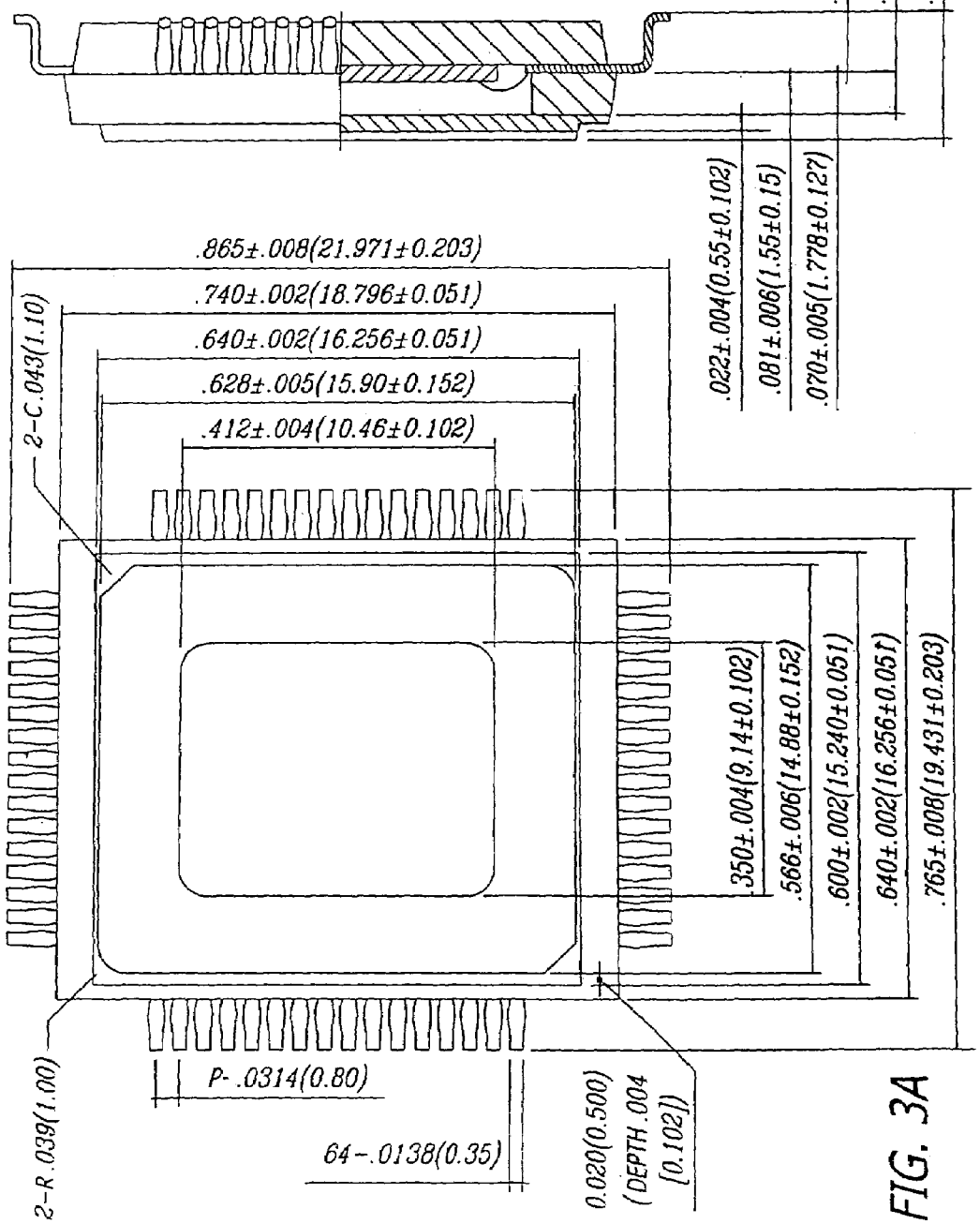
FIG. 3A shows a schematic diagram of one embodiment of the entire IC package.
FIG. 3B shows a side view of the entire IC package.

For one embodiment, the window is approximately 1.2 times the area of the light-sensitive portion of the die. The window size, however, varies depending on its distance away from the die. FIGS. 2 and 3 show schematic diagrams of one embodiment of the lid and molded package.

FIGS. 2A–2C show a schematic of one embodiment of the package lid 30, including the ceramic frame 32 and glass window 34. The first dimension is in mils, the dimension in parentheses is in millimeters. For one embodiment, a glass window 34 is seated into a recessed ledge 40 in the ceramic frame 32.

FIGS. 3A–3B show a schematic of one embodiment of the entire IC package 50 in accordance with present invention. The first dimension indicated for an element is in inches, the second dimension (in parentheses) is in millimeters. Although the embodiment shown includes a particular type of lead frame (quad flat pack-QFP), other types of lead frames may be employed. Moreover, other packages may be used, including leadless packages such as ball grid array (BOA) packages, leadless chip carrier (LCC) packages, and leaded packages such as dual in-line package (DIP), and so forth.

Figure 4:
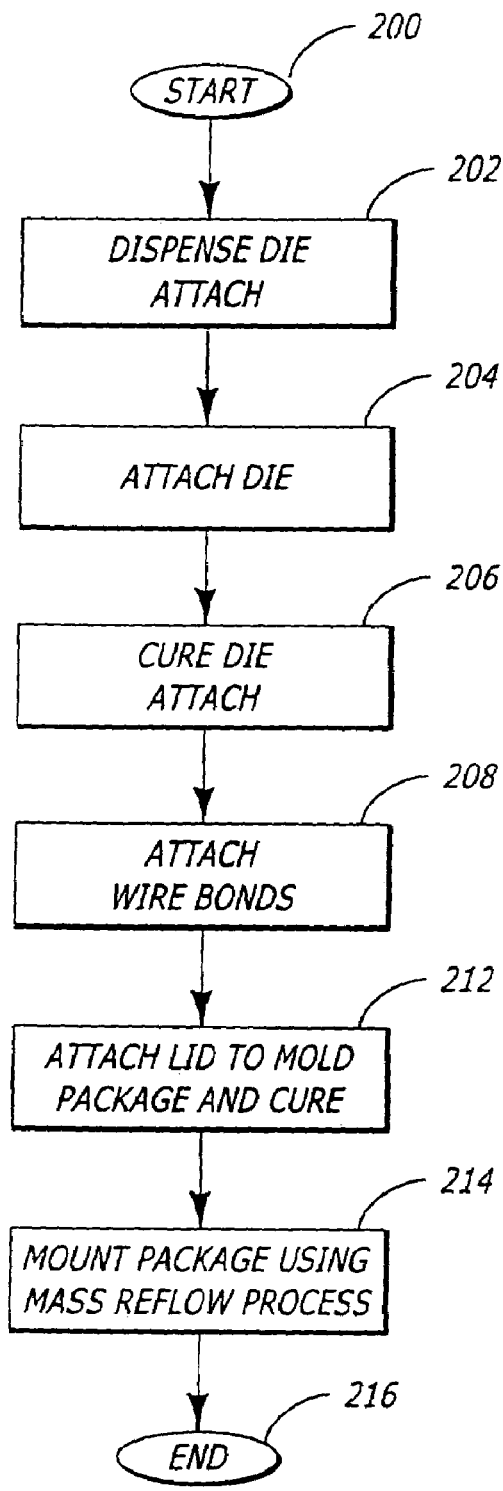
FIG. 4 shows one embodiment of the process for attaching a die onto a windowed non-ceramic package.

FIG. 4 shows one embodiment of the process for attaching a die into a windowed non-ceramic package. At step 202, die attach is dispensed on the molded package. For one embodiment, the die attach is comprised of a low rigidity epoxy such as a silver-filled epoxy, as previously stated.

The process continues at block 204, at which the die is scrubbed, or moved back and forth while pressure is applied to firmly attach the die to the die attach. Good adhesion of the die to a smooth surface of the molded package is achieved without plating the back-side of the die with gold.

The die attach is cured at block 206. It is important to eliminate voids in the die attach, which may cause delamination problems. It has been found that a two stage cure process works better than a one stage cure process for eliminating voids in the die attach. For one embodiment, the die attach is baked at approximately 100° C. for approximately one hour, then the die attach is baked at approximately 150° C. for approximately another hour.

At block 208, wire bonds are attached between the die and the lead frame of the molded package.

At block 212, the lid is attached to the molded package. For one embodiment, the lid comprises the glass window 34 attached to the ceramic frame 32 with a his-phenol A type epoxy. The epoxy is cured by baking. For one embodiment, the curing is performed by raising the temperature to approximately 150° C. for approximately 70 minutes. For one embodiment, the lid is attached to the molded package using the same epoxy that was used to attach the glass window 34 to the ceramic frame 32, and the epoxy is cured by also raising the temperature to approximately 150° C. for approximately 70 minutes.

For one embodiment, the above steps are performed using laminar flow hoods in a dean room that meets level class sub 100, in which there is less than 100 particles of contamination of one micron or less per cubit meter. This helps to prevent particle contamination of the die during assembly.

For one embodiment, the window has a scratch-dig specification of 20 microns. The scratch-dig specification denotes the largest allowable defect in the glass. A larger defect may interfere with the imaging performance of the image sensor.

In order to reduce moisture in the sealed package prior to performing the mass reflow process, an extended bake cycle may be used just prior to bagging. For one embodiment, the sealed package is baked at 125° C. for 48 hours, then it is vacuum sealed in a moisture barrier bag for storage or shipment. This allows the sealed package to meet the Institute for Interconnecting and Packaging Electronic Circuits (IPC) level 4 surface mount requirements. (The IPC is a trade association representing over 2300 companies in the electronic interconnection industry worldwide.)

When the sealed package is ready to be mounted, it is removed from the bag and mounted to a circuit board using a mass reflow process, as shown at block 214. There are various types of mass reflow processes. For one embodiment, an IR/convection mass reflow process is employed that conforms to the following:

peak package body temperature of approximately 225° C.;

time above 215° C. is approximately 30 seconds;

time above 183° C. is approximately 140 seconds.

The windowed non-ceramic package is able to withstand the above mass reflow process without the lid separating from the molded package or die detaching from the molded package.

Mass Reflowable Windowed Non-Ceramic Package with Embedded Frame

Figure 5:
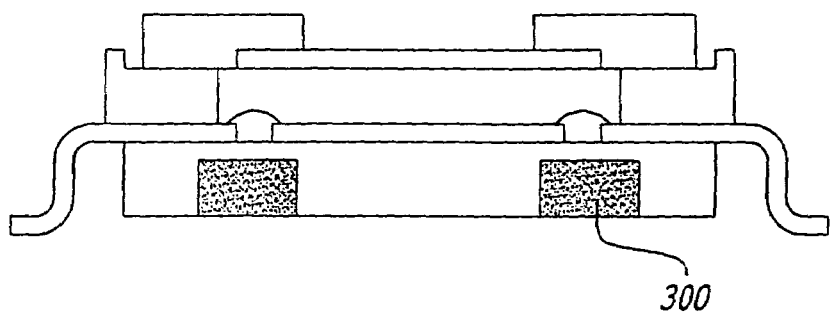
FIG. 5 shows a cross sectional view of one embodiment of the mold compound including an embedded frame.

FIG. 5 shows a cross sectional view of one embodiment of the mold compound including an embedded frame 300. The mold compound substantially surrounds the frame. (It may or may not be surrounded on the bottom surface.) For one embodiment, the frame is made of ceramic to match the CTE of the ceramic frame bordering the window of the IC package. In another embodiment, the embedded frame is made of material having a lower CTE than that of the mold compound. For example, the frame may comprise a copper/tungsten alloy or alloy-42 (an alloy comprising 42% nickel and 58% iron), which is frequently used in leads.

Because the stresses internal to an IC package are difficult to measure, the stresses have been modeled by finite element modeling, which is commonly used as an engineering validation tool of mechanical designs. Table 1 shows exemplary values of the CTEs used in the modeling for the mold compound, the die attach, the silicon die, the window sealant, the window, the ceramic frame, and the leads. Table 1 also shows values of Young's modulus (an indication of stiffness of the material) and Poisson's ratio (an indicative ratio of deformation in one direction when stretched in an orthogonal direction) which were used in the modeling.

Figure 6:
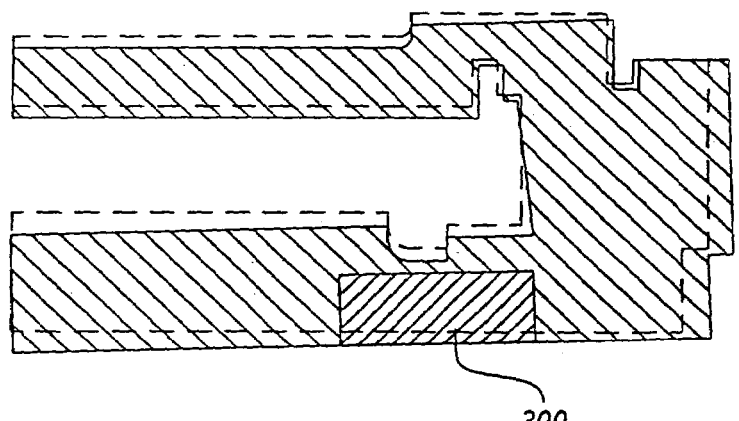
FIGS. 6 and 7 show modeling of warpage patterns at 225° C. of an IC package with an embedded frame and without an embedded frame, respectively.
Figure 7:
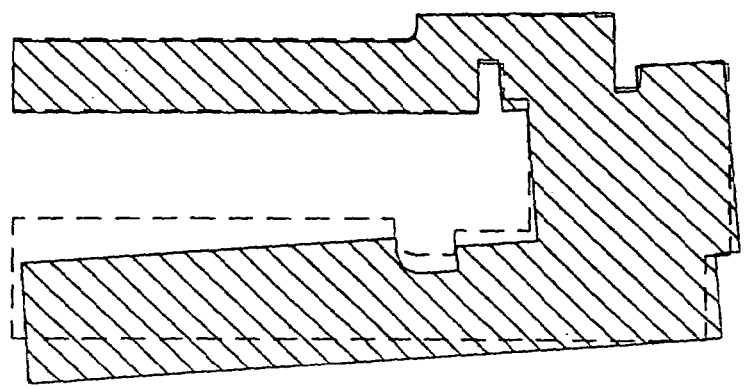

FIGS. 6 and 7 show modeled warpage patterns at 225° C. for an IC package with an embedded frame and without an embedded frame, respectively. Warpage is seen to be significantly reduced using an embedded frame.

The embedded frame may take on a variety of shapes. However, to reduce costs, a simple design such as a square loop or a miniature version of the window frame 32 of FIG. 2 may be used. Applicant has found the best results by the embedded frame overlapping with the periphery of the die as shown in FIGS. 5 and 6.

Figure 8:
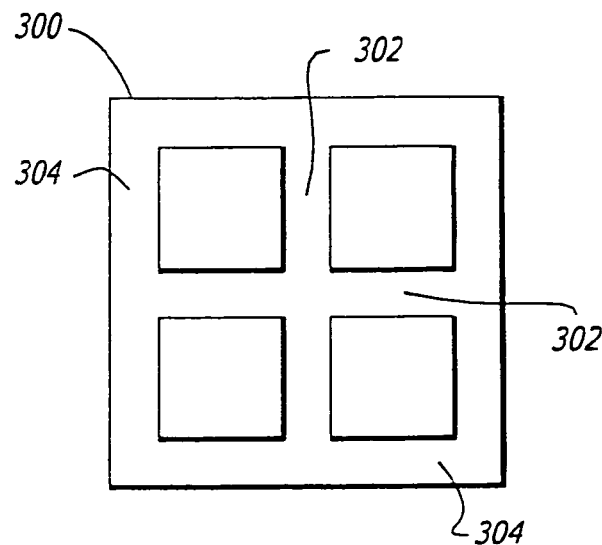
FIG. 8 shows one embodiment of an embedded frame that has cross bars that join the sides of the embedded frame.

For one embodiment, the embedded frame 300 may include cross bars 302 joining the sides 304 for additional support, as shown in FIG. 8. In the miniature version of the window frame 32, a ledge holds the embedded frame firmly

TABLE 1

Materials properties at Different Temperatures

| Components | Modulus, kN/mm² | | | | CTE, ppm/° C. | | | | Poisson's ratio*** |
|---|---|---|---|---|---|---|---|---|---|
| | 25° C. | 150° C. | 155° C. | 225° C. | 25° C. | 150° C. | 155° C. | 225° C. | |
| Mold Compound* | 14.4 | 14.4 | 2.1 | 2.1 | 11.4 | 11.4 | 48.1 | 48.1 | .23 |
| Die Attach* | 8.0 | .08 | .08 | .08 | 25 | 25 | 130 | 130 | .3 |
| Silicon Die | 130 | 130 | 130 | 130 | 2.6 | 3.2 | 3.2 | 3.6 | .23 |
| Window Sealant** | 4.2 | 4.2 | .045 | .045 | 62.1 | 62.1 | 186 | 186 | .35 |
| Glass Window | 72.9 | 72.9 | 72.9 | 72.9 | 6.8 | 7.5 | 7.5 | 7.9 | .208 |
| Ceramic Window Frame | 280.5 | 275.6 | 275.6 | 272.6 | 5.74 | 6.76 | 6.76 | 7.38 | .25 |
| Lead (alloy 42) | 145 | 145 | 145 | 145 | 4.5 | 4.5 | 4.5 | 4.5 | .3 |

*The glass transition temperature (Tg) for mold compound and sealant are 150° C.
**Tg of Die Attach is 103° C.
***Poisson's ratio is considered constant from 25 to 225° C.

According to the above table, the materials properties of mold compound, die attach and sealant remains constant from 25 to its Tg, then change to a different set of values from Tg+5° C. to 225° C. The Silicon properties reflect those of [110] directions.

Table 2 is a summary of the modeled results of the reduction of internal stresses of an IC package using an embedded frame comprising alloy-42. The modeled results show that stresses in an IC package having the embedded frame are reduced significantly for both of the epoxy interfaces between the backside die and the molded package and between the lid and the molded package. This reduction in stress makes it easier to attach larger package sizes via mass reflow since larger package sizes are more susceptible to internal stresses at temperature extremes, such as at mass reflow temperatures.

in the mold compound. A more complicated shape of frame may also be used (for instance a honeycomb pattern), but the additional cost of the frame should be low enough such that the overall package remains less expensive than a flail ceramic package.

In another embodiment, a full glass window without a window frame is attached to the mold compound. An embedded frame reduces the stresses involved during the mass reflow process. For example, an embedded frame made of alloy-42 (CTE~4.5 ppm/C), a copper/tungsten alloy (CTE 6.5~ppm/C), or a ceramic frame (CTE~7.4 ppm/C) may be employed.

The Mold Process

Figure 9A:
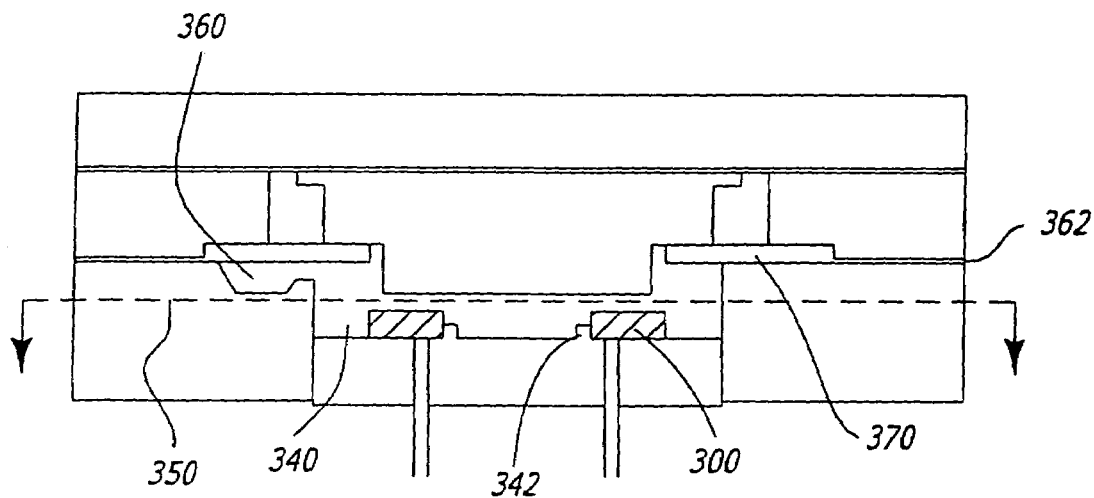
FIGS. 9A and 9B show one embodiment of a mold that can be used to embed a frame within the mold compound.
Figure 9B:
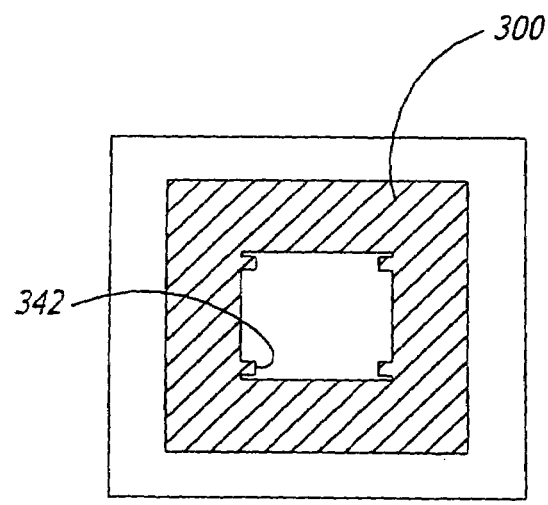

FIGS. 9A and 9B show one embodiment of a mold that can be used to embed a frame within the mold compound.

TABLE 2

| | Warpage in Package Bottom*, µm | | | Maximum Von Mises Stress in Die Attach, MPa | | | Max Von Mises Stress in Window Seal, MPa | | |
|---|---|---|---|---|---|---|---|---|---|
| Temperature° C. | −65 | 223 | 225 | −65 | 25 | 225 | −65 | 25 | 225 |
| Without Embedded Frame | −45.4 | −26.4 | +60.0 | 179.3 | 104.3 | 16.4 | 129.8 | 76.9 | 5.8 |
| With Embedded Frame | −23.4 | −13.6 | +13.3 | 136.5 | 79.4 | 4.8 | 133.2 | 77.4 | 4.7 |
| Difference, % | 48.5 | 48.5 | 77.8 | 23.9 | 23.9 | 70.3 | −2.6 | −0.65 | 19.0 |

*+/−sign indicates the convex/concave warpage.

FIG. 9A shows a cross sectional side view of the mold showing the placement of embedded frame 300 within the mold cavity 340. FIG. 9B shows a top view of the mold cavity corresponding to the dotted line 350 of FIG. 9A that looks down upon the embedded frame 300.

In this embodiment, stoppers 342 are used to hold the embedded frame 300 in place. Runners and a gate 360 located on one side of the mold cavity provides a source of the mold compound. The location of the runners and gate to the mold cavity 340 is designed such that the flow of mold compound will apply pressure over the top surface of the embedded frame and hold the embedded frame down in the mold cavity 340. A vent 362 on the opposite side of the mold allows air to be expelled as the mold compound is supplied into the mold cavity 340. A lead frame 370 is also embedded when the mold compound is supplied to the mold cavity 340.

For one embodiment, multiple molded packages are made at the same time. The molded packages are joined together end-to-end in a strip, as is well known. The molded packages are separated from another in another process step.

Imaging System

Figure 10:
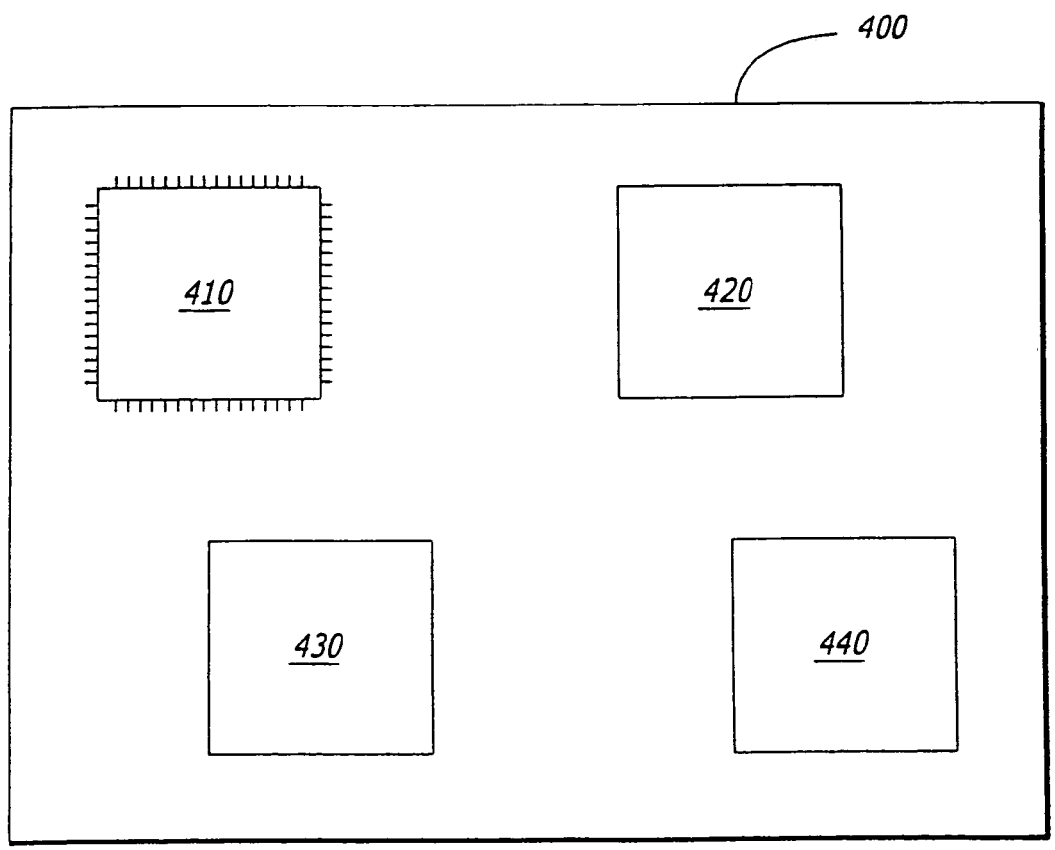
FIG. 10 shows an imaging system comprising an image sensor attached to a circuit board via a mass reflow process.

FIG. 10 shows an imaging system 400 comprising an image sensor utilizing the IC package with an embedded frame. The image sensor is attached to a circuit board via a mass reflow process. The image sensor 410 is employed as part of a camera, silicon eye, or other image device. Typically, the image sensor is electrically coupled to an image processor 420 and a memory 430. The imaging system may also include interconnect circuitry 440 for communicating with other systems, such as a host computer system or other output device. The imaging system may also include a lens system (not shown) to focus the light on the image sensor, as is well-known in the art.

The ability to attach the image sensor via the mass reflow process reduces costs and speeds up the manufacturing process. It also may provide a more reliable connection than manual soldering methods.

Thus, an IC package with an embedded frame capable of being mounted to a circuit board via a mass reflow process is disclosed. The specific arrangements and methods described herein are merely illustrative of the principles of this invention. Numerous modifications in form and detail may be made without departing from the scope of the described invention. For example, with reductions due to the embedded frame of internal stresses at both the epoxy interfaces between the backside die and molded package and between the lid and molded package, extended bake cycles may not be needed. Although this invention has been shown in relation to a particular embodiment, it should not be considered so limited. Rather, the described invention is limited only by the scope of the appended claims.

What is claimed is:

1. A method of making an IC package, the method comprising:
   placing a frame in a mold wherein the frame has a top surface, a bottom surface, and a top-to-bottom opening therein;
   substantially surrounding the frame with a mold compound;
   attaching a die to the mold compound including positioning the die so that its periphery lies over the frame;
   attaching the die to a lead frame of the IC package; and
   enclosing the die by attaching a window to the mold compound above the die.

2. The method of claim 1, wherein the substantially surrounding the frame with a mold compound is performed by substantially surrounding a ceramic frame with a mold compound.

3. The method of claim 2, wherein the substantially surrounding the frame with a mold compound is performed by substantially surrounding an alloy-42 frame with a plastic mold compound.

4. The method of claim 1, wherein the substantially surrounding the frame with a mold compound is performed by substantially surrounding an alloy frame with a mold compound.

5. A method of making an IC package, the method comprising:
   attaching a die to a mold compound having a frame embedded within it including positioning the die so that its periphery lies over the frame wherein the frame has a top surface, a bottom surface, and a top-to-bottom opening therein;
   attaching the die to a lead frame of the IC package; and
   attaching a window to the mold compound above the die, to enclose the die.

6. The method of claim 5, wherein the attaching the window to the mold compound comprises:
   attaching an alloy window frame to the mold compound.

7. The method of claim 5, wherein the attaching the window to the mold compound comprises:
   attaching a ceramic window frame to the mold compound.

8. The method of claim 7 wherein the substantially surrounding the frame with a mold compound comprises substantially surrounding a ceramic frame with the mold compound.

9. The method of claim 5 wherein the attaching the window to the mold compound comprises:
   attaching a window frame that is made of the same material as that of the embedded frame, to the mold compound.

* * * * *

UNITED STATES PATENT AND TRADEMARK OFFICE
CERTIFICATE OF CORRECTION

| | | |
|---|---|---|
| PATENT NO. | : 7,223,631 B2 | Page 1 of 1 |
| APPLICATION NO. | : 11/360147 | |
| DATED | : May 29, 2007 | |
| INVENTOR(S) | : Li et al. | |

It is certified that error appears in the above-identified patent and that said Letters Patent is hereby corrected as shown below:

In column 1, at line 33, delete "(FA)" and insert --(CFA)--.

In column 2, at line 51, delete "FA" and insert --CFA--.

In column 4, at line 25, delete "dean" and insert --clean--.

Signed and Sealed this

Twenty Second Day of April, 2008

JON W. DUDAS
*Director of the United States Patent and Trademark Office*